(12) United States Patent
Ishibayashi

(10) Patent No.: US 6,653,905 B2
(45) Date of Patent: Nov. 25, 2003

(54) AMPLIFIER FOR FM ANTENNAS

(75) Inventor: Katsushiro Ishibayashi, Tokyo (JP)

(73) Assignee: Harada Industry Co., Ltd., Tokyo (JP)

( * ) Notice: Subject to any disclaimer, the term of this patent is extended or adjusted under 35 U.S.C. 154(b) by 0 days.

(21) Appl. No.: 10/376,747

(22) Filed: Feb. 28, 2003

(65) Prior Publication Data

US 2003/0146793 A1 Aug. 7, 2003

Related U.S. Application Data

(63) Continuation of application No. PCT/JP02/06564, filed on Jun. 28, 2002.

(30) Foreign Application Priority Data

Jun. 29, 2001 (JP) .......................... 2001-198825

(51) Int. Cl.[7] .............................. H03F 3/04; H03F 1/00; H03F 3/68
(52) U.S. Cl. ................... 330/302; 330/165; 330/295
(58) Field of Search ........................ 330/165, 295, 330/302

(56) References Cited

U.S. PATENT DOCUMENTS 3,891,934 A * 6/1975 Norton et al. .............. 330/296
3,911,372 A * 10/1975 Seidel ......................... 330/286
4,262,262 A * 4/1981 Hoglund .................... 330/267
6,023,197 A * 2/2000 Ter Laak et al. ........... 330/306
6,172,563 B1 * 1/2001 Trask ......................... 330/149

FOREIGN PATENT DOCUMENTS

| JP | 54-127263 A | 10/1979 |
| JP | 1-278106 A | 11/1989 |
| JP | 3-262216 A | 11/1991 |
| JP | 8-51187 A | 2/1996 |

* cited by examiner

Primary Examiner—Patricia Nguyen
(74) Attorney, Agent, or Firm—Pennie & Edmonds LLP

(57) ABSTRACT

An amplifier comprising a transformer and a plurality of FETs, for example, three FETs. An input terminal, which receives a signal from an FM antenna, is connected to one end of the primary winding of the transformer. A power-supply voltage is applied to one end of the secondary winding of the transformer. A given middle part of the secondary winding is connected to an output terminal. The transistors have their source connected in parallel to the other end of the primary winding of the transformer, their drains connected in parallel to the other end of the secondary winding, and their gates connected to the ground.

2 Claims, 5 Drawing Sheets

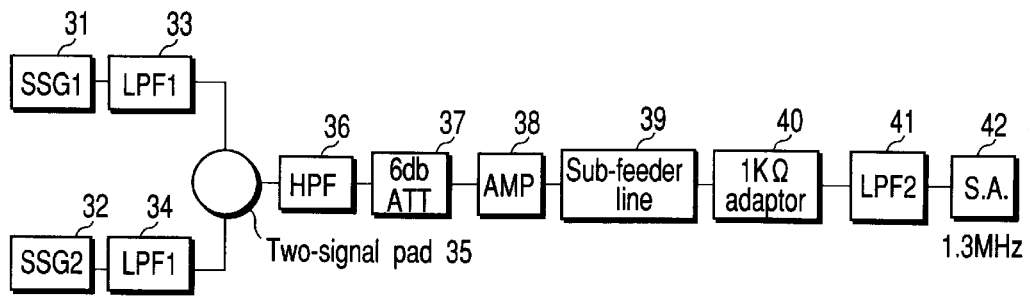
F I G. 2A
| AMP output level (dBμV) | IM2 level (dBμVemf) | |
|---|---|---|
| | This invention II | Conventional amp. I |
| | IM2 1.3MHz | IM2-1.3MHz |
| 105 | 23.1 | 35.1 |
| 107.5 | 28.2 | 40.4 |
| 110 | 33.9 | 45.4 |
| 112.5 | 38.4 | 57.0 |
| 115 | 43.4 | 68.6 |
| 117.5 | 48.0 | 75.9 |
| 120 | 52.9 | |
| 122.5 | 57.4 | |
| 125 | 61.5 | |
F I G. 2B
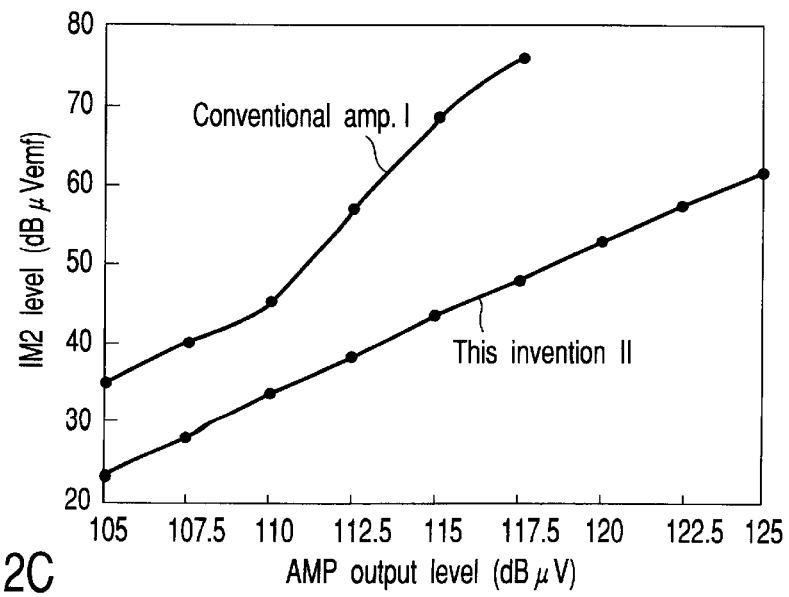
F I G. 2C

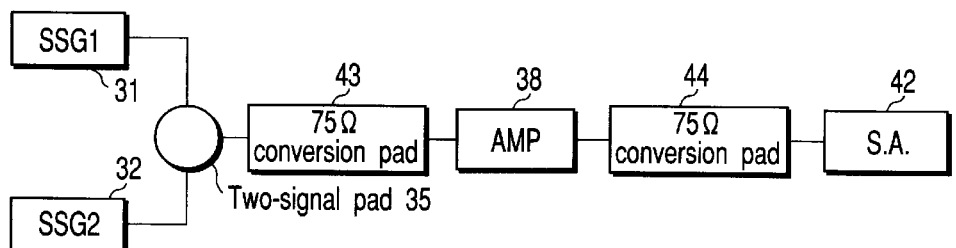
FIG. 3A
| AMP output level (dBµV) | IM3 level (dBµV) | |
|---|---|---|
| | This invention IV | Conventional amp. III |
| | 82.6MHz | 82.6MHz |
| 92.5 | -6.5 | 2.0 |
| 95 | 1.0 | 10.3 |
| 97.5 | 8.5 | 18.6 |
| 100 | 16.0 | 26.9 |
| 102.5 | 23.5 | 35.2 |
| 105 | 31.0 | 43.5 |
| 107.5 | 38.5 | 51.8 |
| 110 | 46.0 | 60.1 |
| 112.5 | 53.5 | 68.4 |
| 115 | 61.0 | 83.0 |
| 117.5 | 68.5 | 98.0 |
| 120 | 76.0 | 113.0 |
FIG. 3B
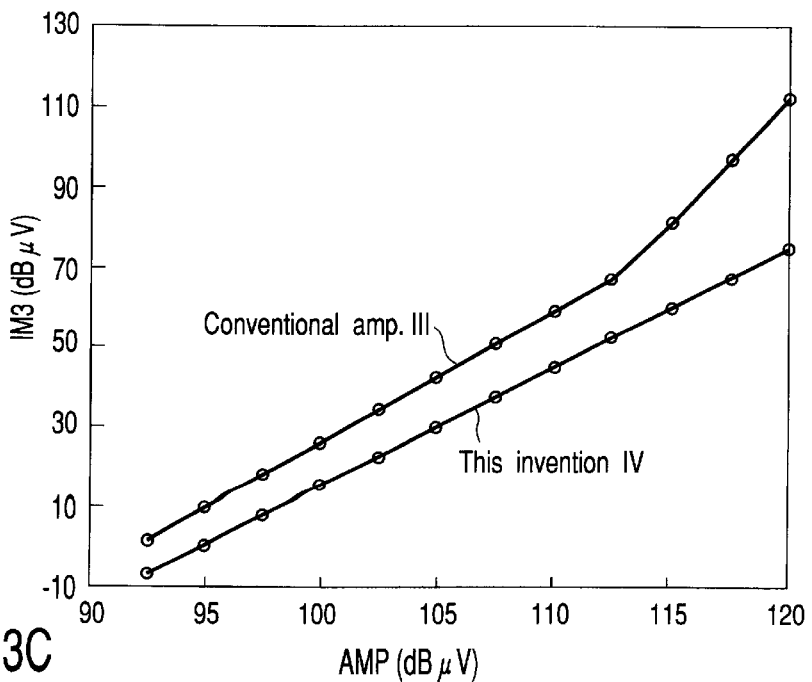
FIG. 3C

| AMP frequency (MHz) | Gain and noise figure | | | |
|---|---|---|---|---|
| | This invention V,VI | | Conventional amplifiers VII,VIII | |
| | Gain (dB) | N.F.(dB) | Gain (dB) | N.F.(dB) |
| 50 | -11.5 | 10.5 | -0.8 | 7.8 |
| 55 | -5.2 | 6.5 | 0.1 | 7.3 |
| 60 | 0.6 | 4.2 | 1.0 | 6.8 |
| 65 | 5.2 | 2.8 | 1.9 | 6.4 |
| 70 | 8.0 | 2.2 | 2.7 | 6.0 |
| 75 | 8.6 | 2.0 | 3.3 | 5.8 |
| 80 | 8.5 | 1.9 | 3.5 | 5.6 |
| 85 | 8.5 | 1.9 | 3.5 | 5.5 |
| 90 | 8.8 | 1.9 | 3.4 | 5.3 |
| 95 | 8.8 | 1.9 | 3.3 | 5.3 |
| 100 | 8.4 | 1.9 | 3.3 | 5.3 |
| 105 | 8.0 | 1.9 | 3.2 | 5.3 |
| 110 | 8.0 | 1.8 | 3.1 | 5.4 |
| 115 | 8.2 | 1.8 | 3.0 | 5.4 |
| 120 | 8.0 | 1.8 | 2.8 | 5.4 |
| 125 | 7.4 | 1.8 | 2.5 | 5.5 |
| 130 | 6.5 | 1.9 | 1.8 | 5.5 |
| 135 | 5.8 | 2.0 | 0.8 | 5.7 |
| 140 | 4.8 | 2.1 | -0.2 | 6.0 |
| 145 | 3.7 | 2.1 | -1.0 | 6.6 |
| 150 | 2.2 | 2.1 | -2.0 | 6.9 |

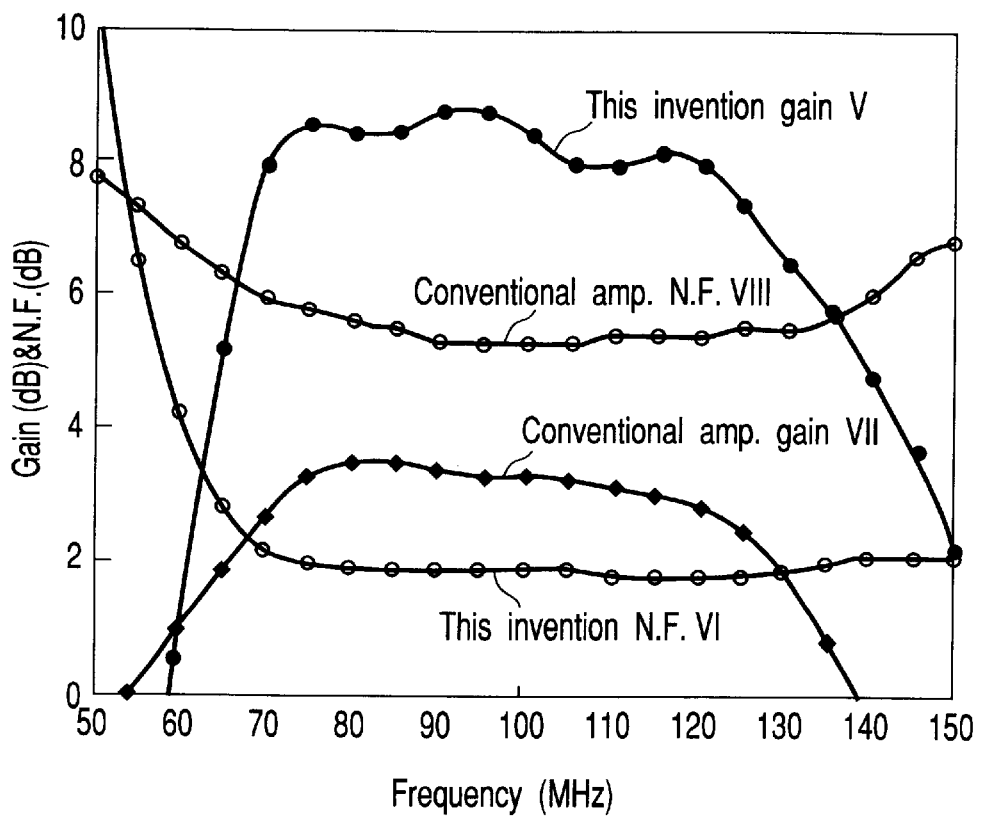
F I G. 4C

AMPLIFIER FOR FM ANTENNAS

CROSS-REFERENCE TO RELATED APPLICATIONS

This is a Continuation Application of PCT Application No. PCT/JP02/06564, filed Jun. 28, 2002, which was not published under PCT Article 21(2) in English.

This application is based upon and claims the benefit of priority from the prior Japanese Patent Application No. 2001-198825, filed Jun. 29, 2001, the entire contents of which are incorporated herein by reference.

BACKGROUND OF THE INVENTION

1. Field of the Invention

The present invention relates to an amplifier for FM antennas.

2. Description of the Related Art

Any amplifier for FM antennas is directly connected to an FM antenna. The amplifier amplifies any signal that the antenna has receives. The signal amplified is supplied to the tuner circuit connected to the output of the amplifier. FIG. 6 is a circuit diagram illustrating an amplifier for FM antennas.

The circuit shown in FIG. 6 is one for use in automobiles. In the circuit, a signal that an FM antenna (not shown) receives is supplied via a capacitor C1 to the base of an NPN transistor Tr1.

The transistor Tr1 has its emitter connected to the ground by a resistor R1. A resistor R2 connects the collector and base of the transistor Tr1. An operating voltage +12[V] is applied from a DC power supply PS to the collector of the transistor Tr1 through a resistor R3. The resistor R3 and the DC power supply PS are connected to one end of a capacitor C2. The other end of the capacitor C2 is connected to the ground.

A resistor R4 and a capacitor C3 connect the emitter of the transistor Tr1 to the output terminal. The output terminal is connected to a tuner circuit (not shown).

The amplifier for FM antennas is designed to exhibit improved strong-input characteristic. It excels in strong-input characteristic such as FM secondary intermodulation distortion characteristic (FN-IM2) or FM tertiary intermodulation distortion characteristic (FM-IM3).

The amplifier is, however, greatly inferior in signal-amplifying characteristic, noise-figure characteristic and the like. It is not satisfactory in terms of all characteristics.

BRIEF SUMMARY OF THE INVENTION

An object of this invention is to provide an amplifier for FM antennas, which has no complex circuit configuration, which yet excels in not only strong-input characteristic but also signal-amplifying characteristic and noise-figure characteristic, and whose characteristics are well balanced.

An amplifier for FM antennas, according to this invention, comprises a transformer and a plurality of field-effect transistors. An input terminal is connected to one end of the primary winding of the transformer. A power-supply voltage is applied to one end of the secondary winding of the transformer. A given middle part of the secondary winding is connected to an output terminal. The transistors have their source connected in parallel to the other end of the primary winding of the transformer, their drains connected in parallel to the other end of the secondary winding, and their gates connected to the ground.

BRIEF DESCRIPTION OF THE SEVERAL VIEWS OF THE DRAWING

FIG. 2A is a block diagram depicting a circuit that measures the FM secondary intermodulation distortion characteristic of the embodiment of the invention;

FIG. 2B is a table showing the FM secondary intermodulation distortion characteristic measured of the embodiment, in comparison with that of a conventional amplifier;

FIG. 2C is a graph representing both characteristics shown in FIG. 2B;

FIG. 3A is a block diagram illustrating a circuit that measures the FM tertiary intermodulation distortion characteristic of the embodiment of the invention;

FIG. 3B is a table showing the FM tertiary intermodulation distortion characteristic measured of the embodiment, in comparison with that of a conventional amplifier;

FIG. 3C is a graph representing both characteristics shown in FIG. 3B;

FIG. 4C is a graph representing the numerical values shown in FIG. 4B;

DETAILED DESCRIPTION OF THE INVENTION

Figure 1:
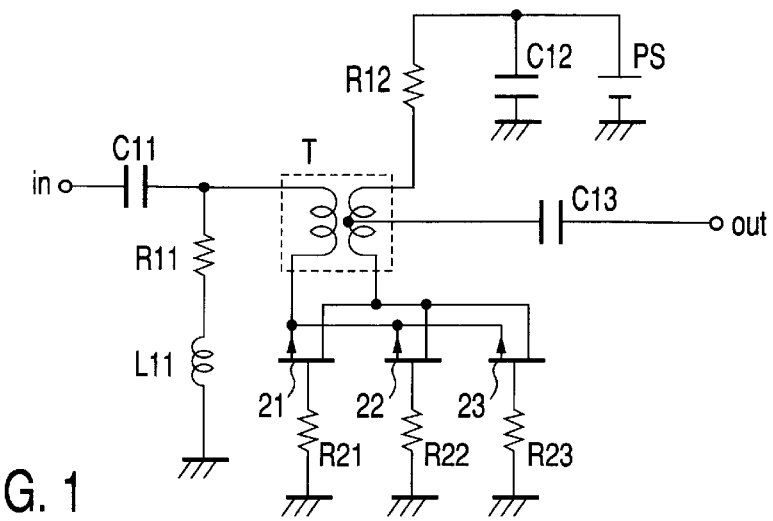
FIG. 1 is a circuit diagram showing an embodiment of the present invention.

FIG. 1 is a circuit diagram of an amplifier for FM antennas. A signal received by an FM antenna (not shown) is supplied to one end of the primary winding of a transformer T through a capacitor C11.

A resistor R11 and an inductance L11 connect the end of the primary winding of the transformer T to the ground. An operating voltage +12[V] is applied from a DC power supply PS via a resistor R12 to the end of the secondary winding of the transformer T. A capacitor C12 is provided between the resistor R12 and the DC power supply PS. The capacitor C12 is connected at one end to the ground and at the other end to the node of the resistor R12 and the DC power supply PS.

Three n-channel FETs (Field-Effect Transistors) 21 to 23 have their sources connected in parallel to the other end of the primary winding of the transformer T. The drains of the FETs 21 to 23 are connected in parallel to other end of the secondary winding of the transformer T. The gates of the FETs 21 to 23 are connected to the ground by resistors R21 to R23, respectively.

A capacitor C13 connects a given middle part of the secondary winding of the transformer T to the output terminal that is connected to a tuner circuit (not shown).

How the embodiment described above operates will be explained.

Figure 6:
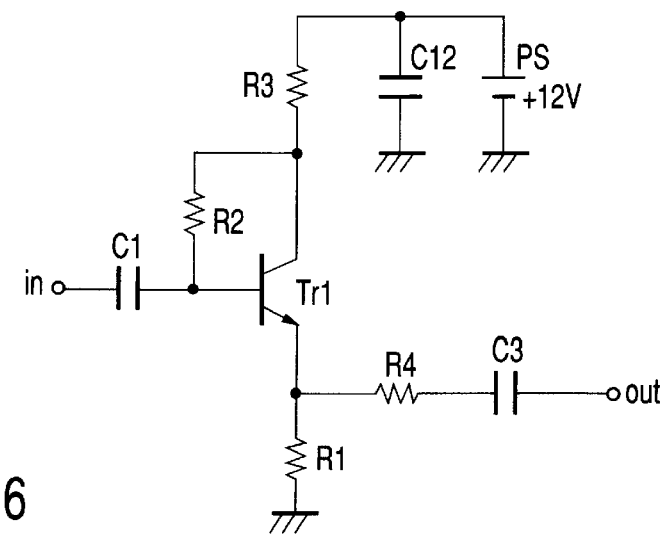
FIG. 6 is a circuit diagram illustrating a conventional amplifier for FM antennas.

FIGS. 2A to 2C show the FM secondary intermodulation distortion characteristic (FM-IM2) measured of the embodiment depicted in FIG. 1, in comparison with that of the conventional amplifier illustrated in FIG. 6.

FIG. 2A depicts a circuit for testing the embodiment. In the circuit, low-pass filters (LPF1) 33 and 34 remove harmonic components from two oscillation-frequency signals supplied from two signal-source lines (SSG1, SSG2) 31 and 32. A two-signal pad 35 superimposes the signals output from the low-pass filters 33 and 34. A high-pass filter (HPF) 36 extracts the FM component of the signal output from the pad 35. An attenuator (ATT) 37 attenuates the FM component by a prescribed value (6 dB). The FM component thus attenuated is supplied to the amplifier (AMP) 38, i.e., the embodiment of the invention or the conventional amplifier, which is tested.

The output of the amplifier 38 is supplied via a sub-feeder line 39, a 1[K] adaptor 40 and a low-pass filter (LPF2) 41 to a spectrum analyzer (S.A.) 52. The analyzer 52 measures the level of FM secondary intermodulation distortion.

The FM secondary intermodulation distortion in the conventional amplifier of FIG. 6 is measured from the oscillation frequency of 80 [MHz] for the signal source (SSG1) 31 and the oscillation frequency 81.3 [MHz] for the signal source (SSG2) 32. More precisely, the level of the distortion measured is a difference of 1.3 [MHz] between these oscillation frequencies.

By contrast, the FM secondary intermodulation distortion in the amplifier of FIG. 1, i.e., the embodiment of the invention, is measured from the oscillation frequency of 90 [MHz] for the signal source (SSG1) 31 and the oscillation frequency 91.3 [MHz] for the signal source (SSG2) 32. More precisely, the level of the distortion measured is a difference of 1.3 [MHz] between these oscillation frequencies.

The other conditions for measuring the distortion are as follows:

| | |
|---|---|
| SSG1, 2: | HP 8648 B |
| LPF1: | Mini-Circuits NLP-150 |
| Cable: | 3 D-2 V(0.3 m) |
| Two-signal pad: | Mini-Circuits ZSC-2-2 |
| HPF: | Mini-Circuits NHP-25 |
| Attenuator: | MODRL CFA-01(6 dB) |
| Sub-feeder line: | 1.5 C-2 V(4 m) |
| 1[kΩ] adaptor loss: | 26.4[dB] |
| LPE2: | Mini-Circuits NLP-1.9 |
| Spectrum analyzer: | HP 8593 E |

FIG. 2B shows the FM secondary intermodulation distortion level [dB$\mu$Vemf] measured, in relation to the desired level [dB$\mu$V] of the waves output from the amplifier 38. FIG. 2C is a graph that shows the distortion level.

As seen from FIG. 2B and FIG. 2C, the characteristic II, i.e., the FM secondary intermodulation distortion of the amplifier shown in FIG. 1, i.e., the embodiment of this invention, is stable at low levels.

On the other hand, the characteristic I, i.e., the FM secondary intermodulation distortion of the conventional amplifier shown in FIG. 6, is stable at relatively high levels. The distortion level is high particularly once the output level exceeds a specific value (110 [dB$\mu$V]).

FIGS. 3A to 3C show the FM tertiary intermodulation distortion characteristic (FM-IM3) measured of the embodiment depicted in FIG. 1, in comparison with that of the conventional amplifier illustrated in FIG. 6.

FIG. 3A depicts a circuit for testing this embodiment. In the circuit, a two-signal pad 35 superimposes the oscillation-frequency signals supplied from two signal-source lines (SSG1, SSG2) 31 and 32. The output of the two-signal pad 35 is supplied to the amplifier (AMP) 38, i.e., the embodiment of the invention or the conventional amplifier, which is tested.

The output of the amplifier 38 is input to a spectrum analyzer (S.A.) 42 through a 50/75 [Ω]-conversion pad 44. The analyzer 42 measures the level of FM tertiary intermodulation distortion.

The FM tertiary intermodulation distortion in the conventional amplifier of FIG. 6 is measured from the oscillation frequencies 78.3 [MHz] and 82.6 [MHz] that have been converted, respectively, from the oscillation frequencies of 80 [MHz] and 81.3 [MHz] for the signal sources (SSG1) 31 and 32.

By contrast, the FM tertiary intermodulation distortion in the amplifier of FIG. 1, i.e., the embodiment of the invention, is measured from the oscillation frequencies 88.7 [MHz] and 92.6 [MHz] that have been converted, respectively, from the oscillation frequencies of 90 [MHz] and 91.3 [MHz] for the signal sources (SSG1) 31 and 32.

The other conditions for measuring the distortion are as follows:

| | |
|---|---|
| SSG1, 2: | HP 8648 B |
| Cable: | 3 D-2 V(0.3 m) × 3 |
| Two-signal pad: | Mini-Circuits ZSC-2-1 |
| 50/75[Ω] conversion pad: | 11694 A |
| Spectrum analyzer: | HP 8593 E |

FIG. 3B shows the FM secondary intermodulation distortion level [dB$\mu$Vemf] measured, in relation to the desired level [dB$\mu$V] of the waves output from the amplifier 38. FIG. 3C is a graph that shows this distortion level.

As seen from FIG. 3B and FIG. 3C, the characteristic IV, i.e., the FM tertiary intermodulation distortion of the amplifier shown in FIG. 1, i.e., the embodiment of the invention, is stable at low levels.

On the other hand, the characteristic III, i.e., the FM tertiary intermodulation distortion of the conventional amplifier shown in FIG. 6, is stable at relatively high levels. The distortion level is high particularly once the output level exceeds a specific value (112.5 [dB$\mu$V]).

Figures 4A, 4B:
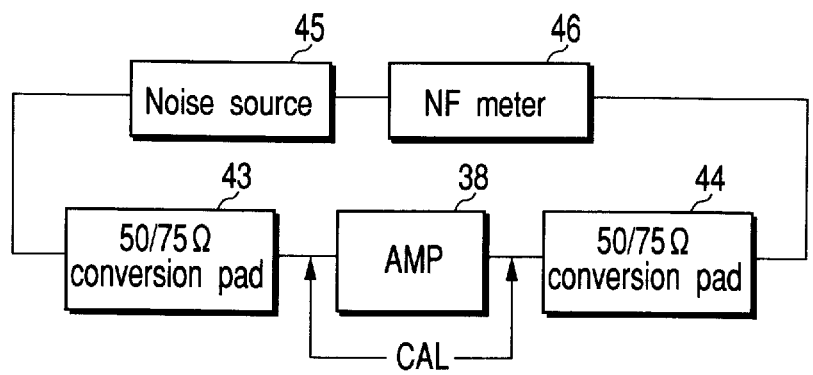
FIG. 4A is a block diagram showing a circuit that measures the signal-amplifying characteristic and noise-figure characteristic of the embodiment of the invention.
FIG. 4B is a table showing the signal-amplifying characteristic and noise-figure characteristic of the embodiment, in comparison with those of a conventional amplifier.

FIGS. 4A to 4C show the FM noise figure and signal-amplifying characteristic, both measured of the embodiment depicted in FIG. 1, in comparison with those of the conventional amplifier illustrated in FIG. 6.

FIG. 4A illustrates a circuit for testing the embodiment. In the circuit, a noise source 45, a 50/75 [Ω]-conversion pad 43, an amplifier (AMP) 38, a 50/75 [Ω]-conversion pad 44, and a noise-figure (NF) meter 46, which are connected forming a ring circuit. The amplifier 38 is the embodiment of this invention or the conventional amplifier, which is tested. The signal-amplifying characteristic of the amplifier 38 is measured from the ratio between the signal levels at the input and output terminals of the amplifier 38.

The conditions for measuring the distortion are as follows:

| | |
|---|---|
| Noise source: | HP 348 B |
| 50/75[Ω] conversion pad: | 11694 A |
| NF meter: | HP 8970 B |

FIG. 4B shows the signal-amplifying characteristic (i.e., gain [dB]) and the noise figure [dB] over a frequency range of 50 [MHz] to 150 [MHz]. FIG. 4C is a graph illustrating these characteristics.

As is evident from FIG. 4B and FIG. 4C, the amplifier, or the embodiment of this invention acquires a sufficiently large gain V of about 8 [dB] over the ordinary FM-frequency range of 76 [MHz] to 109 [MHz].

On the other hand, the conventional amplifier shown in FIG. 6 has a small gain VII of about 3 [dB] over the same FM-frequency range.

The noise figure VI of the amplifier that is the embodiment shown in FIG. 1 has a sufficiently small value of 2 [dB] or less, over the above-mentioned frequency range of 76 [MHz] to 109 [MHz].

By contrast, the noise figure VIII of the conventional amplifier shown in FIG. 6 has a large value of 5 [dB] or more, over the same frequency range.

As has been described, this invention can provide an amplifier for FM antennas, which is not particularly complex in circuit configuration, which excels in not only strong-input characteristic (e.g., FM secondary or tertiary intermodulation distortion characteristics), but also in signal amplifying characteristic and noise-figure characteristic, and whose balanced characteristics are well balanced.

In the amplifier for FM antennas, which is shown in FIG. 1, three FETs 21 to 23 are connected in parallel to the transformer T. The number of transistors used is not limited to three. Rather, it suffices to use a plurality of transistors.

Figure 5:
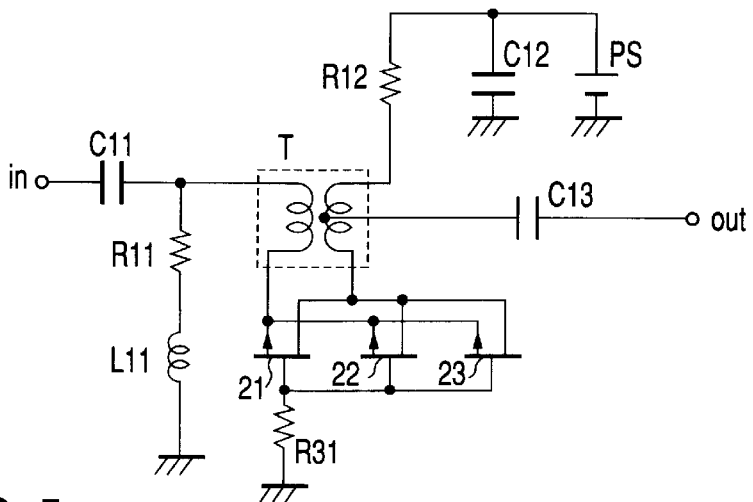
FIG. 5 is a circuit diagram depicting another embodiment of the present invention.

As shown in FIG. 1, the three FETs 21 to 23 have their gates connected to the ground by the resistors R21 to R23, respectively. Instead, the FETs may be connected to the ground by one resistor R31 as is illustrated in FIG. 5. This can simplify the circuit configuration.

The present invention can provide an amplifier for FM antennas, which has no complex circuit configuration, which yet excels in not only strong-input characteristic but also signal-amplifying characteristic and noise-figure characteristic, and whose characteristics are well balanced.

What is claimed is:

1. An amplifier for FM antennas, comprising:

a transformer in which an input terminal is connected to one end of primary winding, a power-supply voltage is applied to one end of the secondary winding and a given middle part of the secondary winding is connected to an output terminal; and a plurality of field-effect transistors having sources connected in parallel to the other end of the primary winding of the transformer, drains connected in parallel to the other end of the secondary winding and gates connected to the ground.

2. An amplifier for FM antennas, according to claim 1, wherein the gates of said plurality of field-effect transistors are connected to the ground by a single element.

* * * * *